(12) United States Patent
Subramanian et al.

(10) Patent No.: US 10,871,970 B1
(45) Date of Patent: *Dec. 22, 2020

(54) MEMORY CHANNEL STORAGE DEVICE DETECTION

(71) Applicant: American Megatrends International, LLC, Norcross, GA (US)

(72) Inventors: Senthamizhsey Subramanian, Suwanee, GA (US); Bejean David Mosher, Acworth, GA (US)

(73) Assignee: AMERICAN MEGATRENDS INTERNATIONAL, LLC, Norcross, GA (US)

( * ) Notice: Subject to any disclaimer, the term of this patent is extended or adjusted under 35 U.S.C. 154(b) by 14 days.

This patent is subject to a terminal disclaimer.

(21) Appl. No.: 16/235,320

(22) Filed: Dec. 28, 2018

Related U.S. Application Data

(63) Continuation of application No. 14/920,518, filed on Oct. 22, 2015, now Pat. No. 10,203,893.

(51) Int. Cl.
*G06F 9/4401* (2018.01)
*G06F 12/02* (2006.01)

(52) U.S. Cl.
CPC ........ *G06F 9/4411* (2013.01); *G06F 12/0238* (2013.01); *G06F 2212/1056* (2013.01); *G06F 2212/7209* (2013.01)

(58) Field of Classification Search
CPC .. G06F 12/0238; G06F 3/0626; G06F 3/0632; G06F 3/0679; G06F 9/4411; G06F 9/4403; G06F 2212/1056; G06F 2212/7209; G06F 2212/214; G11C 29/08; G11C 29/10; G11C 2229/3602; G11C 2229/4402

See application file for complete search history.

(56) References Cited

U.S. PATENT DOCUMENTS

| | | | |
|---|---|---|---|
| 4,264,953 A | | 4/1981 | Douglas et al. |
| 5,012,408 A | * | 4/1991 | Conroy ............... G06F 12/0684 365/230.03 |
| 5,546,557 A | | 8/1996 | Allen et al. |
| 5,612,974 A | * | 3/1997 | Astrachan ............. H03M 13/23 375/295 |
| 5,671,413 A | | 9/1997 | Shipman et al. |
| 5,761,718 A | | 6/1998 | Lin et al. |
| 5,809,527 A | | 9/1998 | Cooper et al. |

(Continued)

FOREIGN PATENT DOCUMENTS

DE      EP1618507 B1     1/2006

OTHER PUBLICATIONS

USPTO Notice of Allowance dated Sep. 23, 2019 in U.S. Appl. No. 14/920,572, Memory Channel Storage Device Initialization, first named inventor: S. Subramanian, 7 pp.

(Continued)

*Primary Examiner* — Michael Krofcheck

(74) *Attorney, Agent, or Firm* — Newport IP, LLC; Leonard J. Hope

(57) ABSTRACT

Technologies are disclosed herein that allow for utilization of memory channel storage ("MCS") devices in a computing system. The MCS device may be detected during a boot phase of the computing system, and the address data for the MCS device may be detected through repeated manipulation of a logical offset. The address data may then be stored for later use in memory allocation.

9 Claims, 6 Drawing Sheets

(56) References Cited

U.S. PATENT DOCUMENTS

| | | | |
|---|---|---|---|
| 5,809,555 | A | 9/1998 | Hobson |
| 5,905,888 | A | 5/1999 | Jones et al. |
| 6,567,940 | B1 | 5/2003 | Kroon et al. |
| 7,340,578 | B1 | 3/2008 | Khanzode |
| 8,131,919 | B1 | 3/2012 | Gasser et al. |
| 8,504,794 | B1 | 8/2013 | Glasco et al. |
| 8,713,379 | B2 | 4/2014 | Takefman et al. |
| 8,792,200 | B1 | 7/2014 | Tam et al. |
| 10,203,893 | B2 | 2/2019 | Subramanian et al. |
| 2001/0042225 | A1 | 11/2001 | Cepulis et al. |
| 2002/0133695 | A1 | 9/2002 | Khatri et al. |
| 2002/0184579 | A1 | 12/2002 | Alvarez, II et al. |
| 2003/0095437 | A1 | 5/2003 | Imamiya |
| 2004/0143773 | A1 | 7/2004 | Chen |
| 2005/0027832 | A1* | 2/2005 | Bavaria ............... G06F 13/102 709/220 |
| 2006/0082918 | A1 | 4/2006 | Kosugi et al. |
| 2006/0089934 | A1 | 4/2006 | Jibbe et al. |
| 2006/0248107 | A1 | 11/2006 | Coronado et al. |
| 2007/0055793 | A1 | 3/2007 | Huang et al. |
| 2007/0055856 | A1 | 3/2007 | Zimmer et al. |
| 2007/0101200 | A1 | 5/2007 | Grimes et al. |
| 2007/0220167 | A1 | 9/2007 | Golding et al. |
| 2008/0184073 | A1 | 7/2008 | Wang et al. |
| 2009/0119498 | A1 | 5/2009 | Narayanan |
| 2009/0282195 | A1 | 11/2009 | Wang |
| 2010/0161937 | A1 | 6/2010 | Tanaka |
| 2010/0191896 | A1 | 7/2010 | Yang et al. |
| 2010/0274953 | A1 | 10/2010 | Lee et al. |
| 2013/0086311 | A1* | 4/2013 | Huang ............... G06F 3/0659 711/103 |
| 2013/0297880 | A1 | 11/2013 | Flynn |
| 2014/0082262 | A1 | 3/2014 | Nichimuthu et al. |
| 2014/0289454 | A1 | 9/2014 | Nango |
| 2015/0074386 | A1 | 3/2015 | Huang et al. |
| 2015/0356024 | A1* | 12/2015 | Loh .................. G06F 12/1054 711/113 |
| 2016/0019138 | A1* | 1/2016 | Lee .................. G06F 12/08 711/103 |
| 2016/0070913 | A1 | 3/2016 | Kulkarni et al. |
| 2016/0085455 | A1 | 3/2016 | Cohen et al. |
| 2016/0098344 | A1 | 4/2016 | Gorobets et al. |
| 2016/0188252 | A1 | 6/2016 | Lee |
| 2016/0188347 | A1 | 6/2016 | Berlin |
| 2016/0188423 | A1 | 6/2016 | Meaney et al. |
| 2016/0283379 | A1* | 9/2016 | Samanta ............. G06F 12/128 |
| 2016/0328156 | A1 | 11/2016 | Swarbrick et al. |
| 2017/0115919 | A1 | 4/2017 | Subramanian |
| 2017/0115920 | A1 | 4/2017 | Subramanian |
| 2017/0147357 | A1 | 5/2017 | Mudusuru et al. |

OTHER PUBLICATIONS

USPTO Advisory Action dated Nov. 28, 2018 in U.S. Appl. No. 14/920,572, Memory Channel Storage Device Initialization, first named inventor: S. Subramanian, 6 pp.

USPTO Final Office Action dated Oct. 3, 2018 in U.S. Appl. No. 14/920,572, Memory Channel Storage Device Initialization, first named inventor: S. Subramanian, 14 pp.

USPTO Non-Final Office Action dated Jul. 24, 2018 in U.S. Appl. No. 14/920,572, Memory Channel Storage Device Initialization, first named inventor: S. Subramanian, 21 pp.

USPTO Advisory Action dated Mar. 26, 2018 in U.S. Appl. No. 14/920,572, Memory Channel Storage Device Initialization, first named inventor: S. Subramanian, 5 pp.

USPTO Final Office Action dated Dec. 4, 2017 in U.S. Appl. No. 14/920,572, Memory Channel Storage Device Initialization, first named inventor: S. Subramanian, 21 pp.

USPTO Non-Final Office Action dated May 2, 2017 in U.S. Appl. No. 14/920,572, Memory Channel Storage Device Initialization, first named inventor: S. Subramanian, 25 pp.

USPTO Final Office Action dated Feb. 1, 2017 in U.S. Appl. No. 14/920,572, Memory Channel Storage Device Initialization, first named inventor: S. Subramanian, 21 pp.

USPTO Non-Final Office Action dated Aug. 4, 2016 in U.S. Appl. No. 14/920,572, Memory Channel Storage Device Initialization, first named inventor: S. Subramanian, 21 pp.

Web article: "Memory Channel Storage" (© 2015 Diablo Technologies, Inc.), [online][retrieved on Oct. 19, 2015] retrieved from: http://www.diablo-technologies.com/memory-channel-storage/ 3 pp.

USPTO Notice of Allowance dated Sep. 25, 2018 in U.S. Appl. No. 14/920,518, Memory Channel Storage Device Detection, first named inventor: S. Subramanian, 14 pp.

USPTO Non-Final Office Action dated Jun. 25, 2018 in U.S. Appl. No. 14/920,518, Memory Channel Storage Device Detection, first named inventor: S. Subramanian, 24 pp.

USPTO Final Office Action dated Oct. 13, 2017 in U.S. Appl. No. 14/920,518, Memory Channel Storage Device Detection, first named inventor: S. Subramanian, 27 pp.

USPTO Non-Final Office Action dated Apr. 4, 2017 in U.S. Appl. No. 14/920,518, Memory Channel Storage Device Detection, first named inventor: S. Subramanian, 24 pp.

USPTO Final Office Action dated Dec. 9, 2016 in U.S. Appl. No. 14/920,518, Memory Channel Storage Device Detection, first named inventor: S. Subramanian, 20 pp.

USPTO Non-Final Office Action dated Jul. 29, 2016 in U.S. Appl. No. 14/920,518, Memory Channel Storage Device Detection, first named inventor: S. Subramanian, 30 pp.

* cited by examiner

MEMORY CHANNEL STORAGE DEVICE DETECTION

CROSS-REFERENCE TO RELATED APPLICATION

This application is a continuation of U.S. patent application Ser. No. 14/920,518, filed Oct. 22, 2015, the content of which application is hereby expressly incorporated herein by reference in its entirety.

BACKGROUND

Memory Channel Storage ("MCS") architecture is an architecture allowing storage devices other than random access memory ("RAM") to be installed in memory modules or slots in relatively close proximity to processing resources. For example, MCS architecture allows solid-state drives having many times the conventional storage capacity of traditional RAM modules to be installed in dual in-line memory module ("DIMM") slots near a processor. The short distance between the devices and processing resources, and the large capacity of the devices, offer many advantages in increasing the computational characteristics of an underlying system.

However, as the drives or other storage devices are connected to the memory bus, it is necessary to prevent allocation of memory addresses associated with the MCS devices as normal memory. Normal memory allocation generally occurs during an initial boot phase of a computer system while MCS devices may not be accessible during this phase, increasing the difficulty in allowing MCS devices to be added/removed as desired by an end user. It is with respect to these and other considerations that the disclosure made herein is presented.

SUMMARY

Technologies are described herein for systems and methods for memory channel storage device ("MCSD" or "MCS device") initialization. Through the utilization of the technologies and concepts presented herein, devices utilizing the MCS architecture may be initialized during an initial boot phase, even if not fully identifiable or addressable. Furthermore, changes in placement and location of devices utilizing the MCS architecture may be detected during booting such that new location information is appropriately stored, and therefore correct allocation of memory, is achieved during the initial boot phase of subsequent boot-ups.

According to one aspect presented herein, a computer-implemented method is provided for initializing a MCS device. The method identifies that a MCS device is deployed at a computing system. The method locates an address range for the MCS device based on a logical offset from a physical memory boundary. The method also stores the located address range in non-volatile memory.

According to another aspect presented herein, a computer-readable storage medium has computer-executable instructions which, when executed by a computer, causes the computer to identify that a MCS device is deployed at the computer. The computer-executable instructions also cause the computer to locate an address range for the MCS device based on a logical offset from a physical memory boundary. The located address range is stored in non-volatile memory.

According to yet another aspect presented herein, a computing system is provided. The computing system includes a processor and a MCS device in communication with the processor. The computing system also includes a computer-readable storage medium having computer-executable instructions which, when executed by the processor, cause the processor to identify that a MCS device is deployed at the computing system. Additionally, the computer-executable instructions also cause the processor to locate an address range for the MCS device based on a logical offset from a physical memory boundary. The located address range is stored in non-volatile memory.

It should be appreciated that the above-described subject matter may also be implemented as a computer-controlled apparatus, a computer process, a computing system, or as an article of manufacture such as a computer-readable medium. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
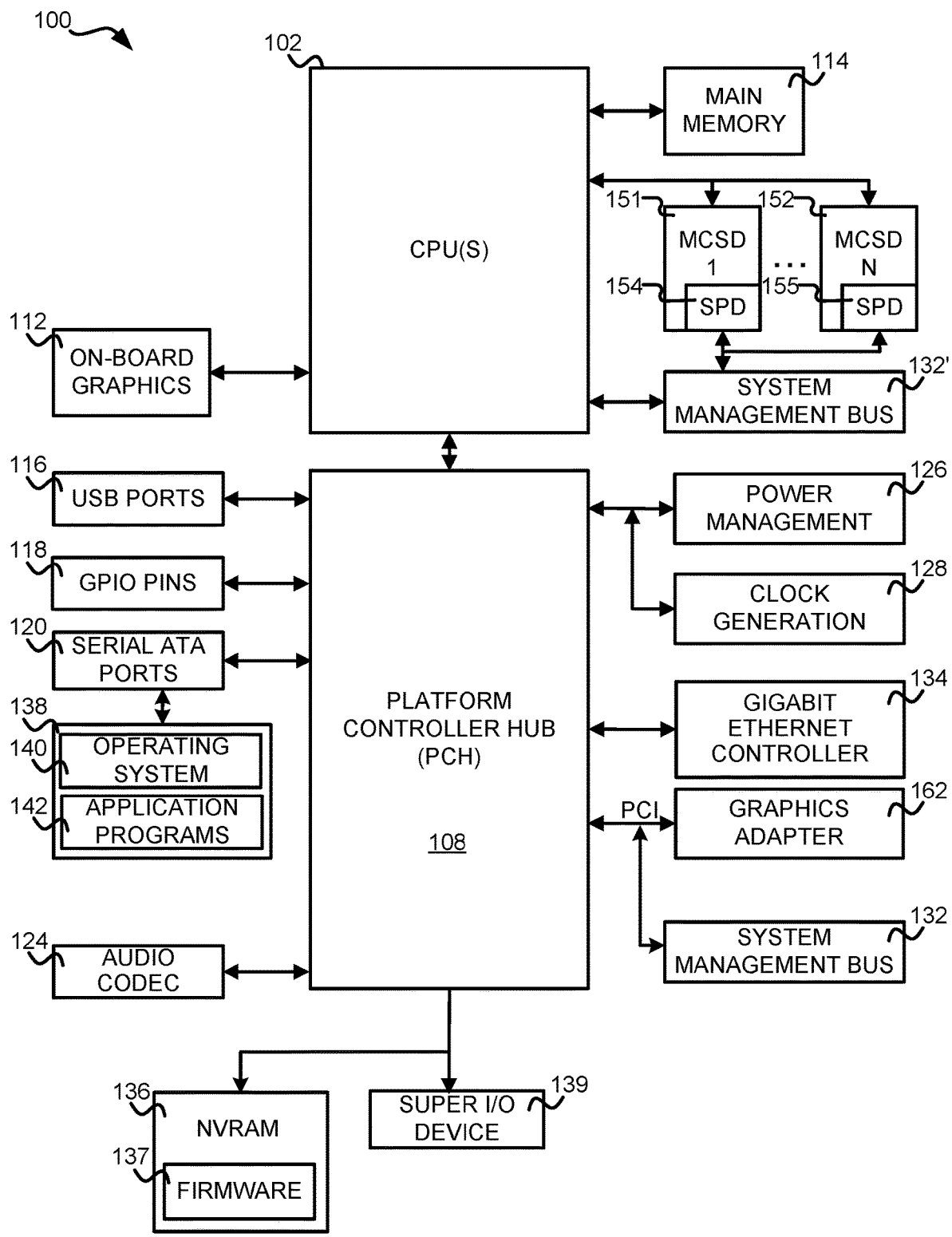
FIG. 1 is a computer architecture diagram that illustrates various components of a computer that provides an illustrative operating environment for the implementations presented herein.

Embodiments of the disclosure presented herein provide methods, systems, apparatuses, and computer-readable media for memory channel storage device detection and initialization. In the following detailed description, references are made to the accompanying drawings that form a part hereof, and in which are shown by way of illustration specific embodiments or examples. Referring now to the drawings, in which like numerals represent like elements throughout the several figures, aspects of an exemplary operating environment and the implementations provided herein will be described.

FIG. 1 and the following discussion provide a general description of a suitable computing environment in which embodiments presented herein may be implemented. While the embodiments presented herein are described in the general context of program modules that execute in conjunction with the execution of a computer firmware, those skilled in the art will recognize that various embodiments may also be implemented in combination with other program modules.

Generally, program modules include routines, programs, components, data structures, and other types of structures that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, embedded systems, and the like. Embodiments presented herein may also be practiced in distributed computing environments where tasks are performed by remote processing devices that are linked through a communications network. In a distributed computing environment, program modules may be located in both local and remote memory storage devices.

Turning now to FIG. 1, an illustrative computer architecture for practicing the embodiments discussed herein will be described. It should be appreciated that although the embodiments described herein are discussed in the context of a conventional desktop or server computer, the embodiments may be utilized with virtually any type of computing device. FIG. 1 shows an illustrative computer architecture for a computing system 100 that is operative for MCSD utilization.

In order to provide the functionality described herein, the computing system 100 can include a baseboard, or "motherboard," which can be a printed circuit board to which a multitude of components or devices may be connected by way of a system bus or other electrical communication path. In one illustrative embodiment, a central processing unit ("CPU") 102 operates in conjunction with a Platform Controller Hub ("PCH") 108. The CPU 102 may be a standard central processor that performs arithmetic and logical operations necessary for the operation of the computing system 100. The computing system 100 may include a multitude of CPUs 102. Each CPU 102 might include multiple processing cores.

The CPU 102 provides an interface to a random access memory ("RAM") used as the main memory 114 in the computing system 100 and, possibly, to an on-board graphics adapter 112. The interface to RAM may include several memory buses, channels, and/or other interfaces including physical slots such as DIMM slots. Accordingly, one or more MCSD 151 and 152 may be used as storage in the computing system 100. According to at least one implementation, each MCSD 151 and 152 includes a serial presence detect ("SPD") chipset 154 and 155, respectively, storing identifying information including serial numbers and manufacturer data. Additionally, each MCSD 151 and 152 may be located through identification of an associated CPU, and associated memory channel, and an associated physical slot. Thus, for example, the MCSD 151 may be located at CPU 1, Channel 1, Slot 1, while the MCSD 152 may be located at CPU 1, Channel 1, Slot N. According to one embodiment of the invention the one or more MCSD 151 and 152 may comprise a version of the MEMORY CHANNEL STORAGE from DIABLO TECHNOLOGIES. It should be appreciated that other MCSDs may also be utilized. Any number of CPUs, memory channels, and physical slots may be included in a desired implementation. Accordingly, the particular number and arrangement of MCS devices illustrated should not be construed as limiting.

The PCH 108 may provide an interface between the CPU 102 and the remainder of the computing system 100. The PCH 108 may also provide a system management bus 132 for use in managing the various components of the computing system 100. An example system management bus includes the system management bus 132', which may be used to access information stored in each SPD chipset 154, 155 described above.

The PCH 108 may also be responsible for controlling many of the input/output functions of the computing system 100. In particular, the PCH 108 may provide one or more universal serial bus ("USB") ports 116, an audio codec 124, a Gigabit Ethernet Controller 134, and one or more general purpose input/output ("GPIO") pins 118. The USB ports 116 may include USB 2.0 ports, USB 3.0 ports and USB 3.1 ports among other USB ports. The audio codec 124 may include Intel High Definition Audio, Audio Codec '97 ("AC'97") and Dolby TrueHD among others. Power management circuitry 126 and clock generation circuitry 128 may also be utilized through the PCH 108.

The PCH 108 may also include functionality for providing networking functionality through a Gigabit Ethernet Controller 134. The Gigabit Ethernet Controller 134 is capable of connecting the computing system 100 to another computing system via a network. Connections which may be made by the Gigabit Ethernet Controller 134 may include LAN or WAN connections. LAN and WAN networking environments are commonplace in offices, enterprise-wide computer networks, intranets, and the internet.

The PCH 108 may also provide a bus for interfacing peripheral card devices such as a graphics adapter 162. In one embodiment, the bus comprises a PCI bus. The PCI bus may include a Peripheral Component Interconnect ("PCI") bus, a Peripheral Component Interconnect eXtended ("PCI-X") bus or a Peripheral Component Interconnect Express ("PCIe") bus, among others.

The PCH 108 is also configured to provide one or more interfaces for connecting mass storage devices to the computing system 100. For instance, according to an embodiment, the PCH 108 includes a serial advanced technology attachment ("SATA" or "serial ATA") adapter for providing one or more serial ATA ports 120. The serial ATA ports 120 may be connected to one or more mass storage devices storing an operating system 140 and application programs 142, such as the SATA disk drive 138. As known to those skilled in the art, an operating system 140 comprises a set of programs that control operations of a computer and allocation of resources. An application program 142 is software that runs on top of the operating system 140 software, or other runtime environment, and uses computer resources to perform application specific tasks desired by the user.

According to one embodiment of the invention, the operating system 140 comprises the LINUX operating system. According to another embodiment of the invention the operating system 140 comprises a version of the WINDOWS operating system from MICROSOFT CORPORATION. According to other embodiments, the operating system 140 can comprise the UNIX, SOLARIS, or Mac OS X operating system. It should be appreciated that other operating systems may also be utilized.

The mass storage devices connected to the PCH 108, and their associated computer-readable storage media, provide non-volatile storage for the computing system 100. Although the description of computer-readable storage media contained herein refers to a mass storage device, such as a hard disk or CD-ROM drive, it should be appreciated by those skilled in the art that computer-readable storage media can be any available media that can be accessed by the computing system 100.

By way of example, and not limitation, computer-readable storage media may comprise computer storage media and communication media. Computer storage media includes volatile and non-volatile, removable and non-removable media implemented in any method or technology for storage of information such as computer-readable instructions, data structures, program modules or other data. However, computer-readable storage media does not encompass transitory signals. Computer storage media includes, but is not limited to, RAM, ROM, EPROM, EEPROM, flash memory or other solid state memory technology, CD-ROM, DVD, HD-DVD, BLU-RAY, or other optical storage, magnetic cassettes, magnetic tape, magnetic disk storage or other magnetic storage devices, or any other medium which can be used to store the desired information and which can be accessed by the computing system 100.

A low pin count ("LPC") interface may also be provided by the PCH 108 for connecting a Super I/O device 139. The Super I/O device 139 is responsible for providing a number of input/output ports, including a keyboard port, a mouse port, a serial interface, a parallel port, and other types of input/output ports. The LPC interface may also connect a computer storage media such as a ROM or a flash memory such as a non-volatile random access memory ("NVRAM") 136 for storing the firmware 137 that includes program code containing the basic routines that help to start up the computing system 100 and to transfer information between elements within the computing system 100. Some examples of firmware 137 include Basic Input/Output System ("BIOS"), firmware that is compatible with the Unified Extensible Firmware Interface ("UEFI"), or Open Firmware among others.

It should be appreciated that the program modules disclosed herein, including the firmware 137, may include software instructions that, when loaded into the CPU 102 and executed, transform a general-purpose computing system into a special-purpose computing system customized to facilitate all, or part of, the operations disclosed herein. As detailed throughout this description, the program modules may provide various tools or techniques by which the computing system 100 may participate within the overall systems or operating environments using the components, logic flows, and/or data structures discussed herein.

The CPU 102 may be constructed from any number of transistors or other circuit elements, which may individually or collectively assume any number of states. More specifically, the CPU 102 may operate as a state machine or finite-state machine. Such a machine may be transformed to a second machine, or a specific machine, by loading executable instructions contained within the program modules. These computer-executable instructions may transform the CPU 102 by specifying how the CPU 102 transitions between states, thereby transforming the transistors or other circuit elements constituting the CPU 102 from a first machine to a second machine, wherein the second machine may be specifically configured to perform the operations disclosed herein. The states of either machine may also be transformed by receiving input from one or more user input devices, network interfaces (such as the Gigabit Ethernet Controller 134), other peripherals, other interfaces, or one or more users or other actors. Either machine may also transform states, or various physical characteristics of various output devices such as printers, speakers, video displays, or otherwise.

Encoding the program modules may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules may transform the physical state of the semiconductor memory when the software or firmware 137 is encoded therein. For example, the software may transform the state of transistors, capacitors, or other discrete circuit elements constituting the semiconductor memory.

As another example, the storage media may be implemented using magnetic or optical technology such as hard drives or optical drives. In such implementations, the program modules may transform the physical state of magnetic or optical media, when the software is encoded therein. These transformations may include altering the magnetic characteristics of particular locations within given magnetic media. These transformations may also include altering the physical features or characteristics of particular locations within given optical media to change the optical characteristics of those locations. It should be appreciated that various other transformations of physical media are possible without departing from the scope and spirit of the present description.

It should be appreciated that the computing system 100 may comprise other types of computing devices, including hand-held computers, embedded computer systems, personal digital assistants, and other types of computing devices known to those skilled in the art. It is also contemplated that the computing system 100 may not include all of the components shown in FIG. 1, may include other components that are not explicitly shown in FIG. 1, or may utilize an architecture completely different than that shown in FIG. 1.

Figure 2:
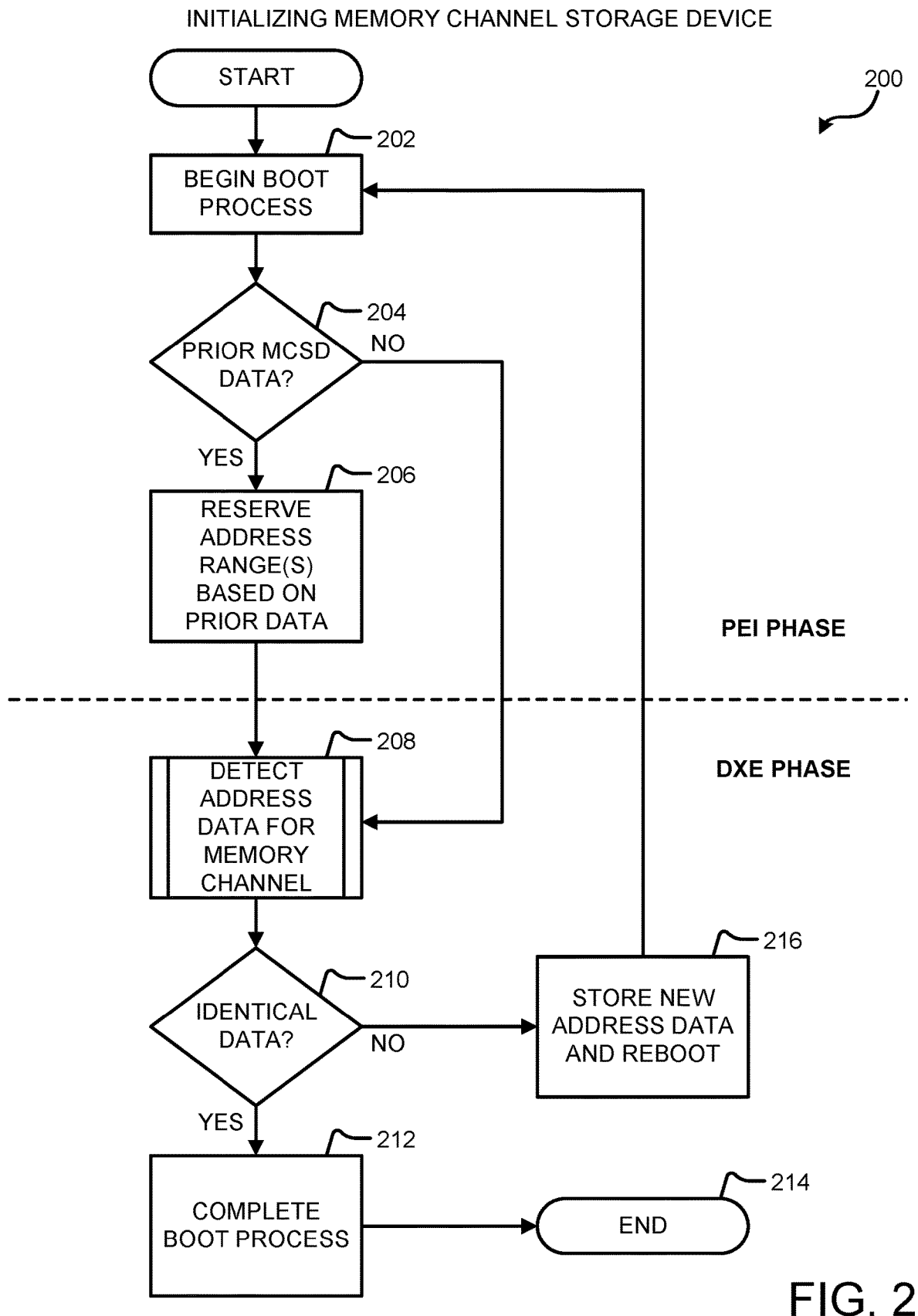
FIG. 2 is a flow diagram showing a routine for initializing a memory channel storage device according to the technologies presented herein.

Referring now to FIG. 2, a flow diagram showing a routine 200 for memory channel storage device initialization according to the technologies presented herein will be described. It should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

The routine 200 begins at operation 202 where the booting process of the computing system 100 may be initiated thereby beginning execution of one or more portions of the firmware 137. Upon initiating the boot process, the firmware 137 determines whether any prior MCSD data has been stored in the NVRAM 136 at operation 204. Prior MCSD data may include location information for each device as described above with reference to devices 151, 152, and may be stored at NVRAM 136 or in any other storage device accessible during the pre-extensible-firmware-interface initialization ("PEI") phase of booting. If prior MCSD data has been stored, the firmware 137 may reserve address ranges based on the stored MSCD data such that these addresses are not allocated as normal memory, at operation 206.

Thereafter, during a driver execution environment ("DXE") phase of booting, the firmware 137 may detect address data for memory channels of the computing system 100, at operation 208. The detecting may include detecting and locating all connected MCS devices and retrieving or establishing their associated location data. If the new location data is identical to the previously stored and reserved data from operation 206, at operation 210, the firmware 137 may complete the boot process at operation 212. From operation 212, the routine 200 ends at operation 214.

However, if, for example, no prior MCSD data is stored, no identical data can be identified and the newly acquired data may be stored as new address data at operation 216, and a reboot may be requested. Thereafter, through iteration through operations 202-210, movement and replacement of MCS devices may be easily detected and location information may be stored/updated while the system is efficiently rebooted to reserve correct memory address space for memory and for the MCS devices.

Figure 3:
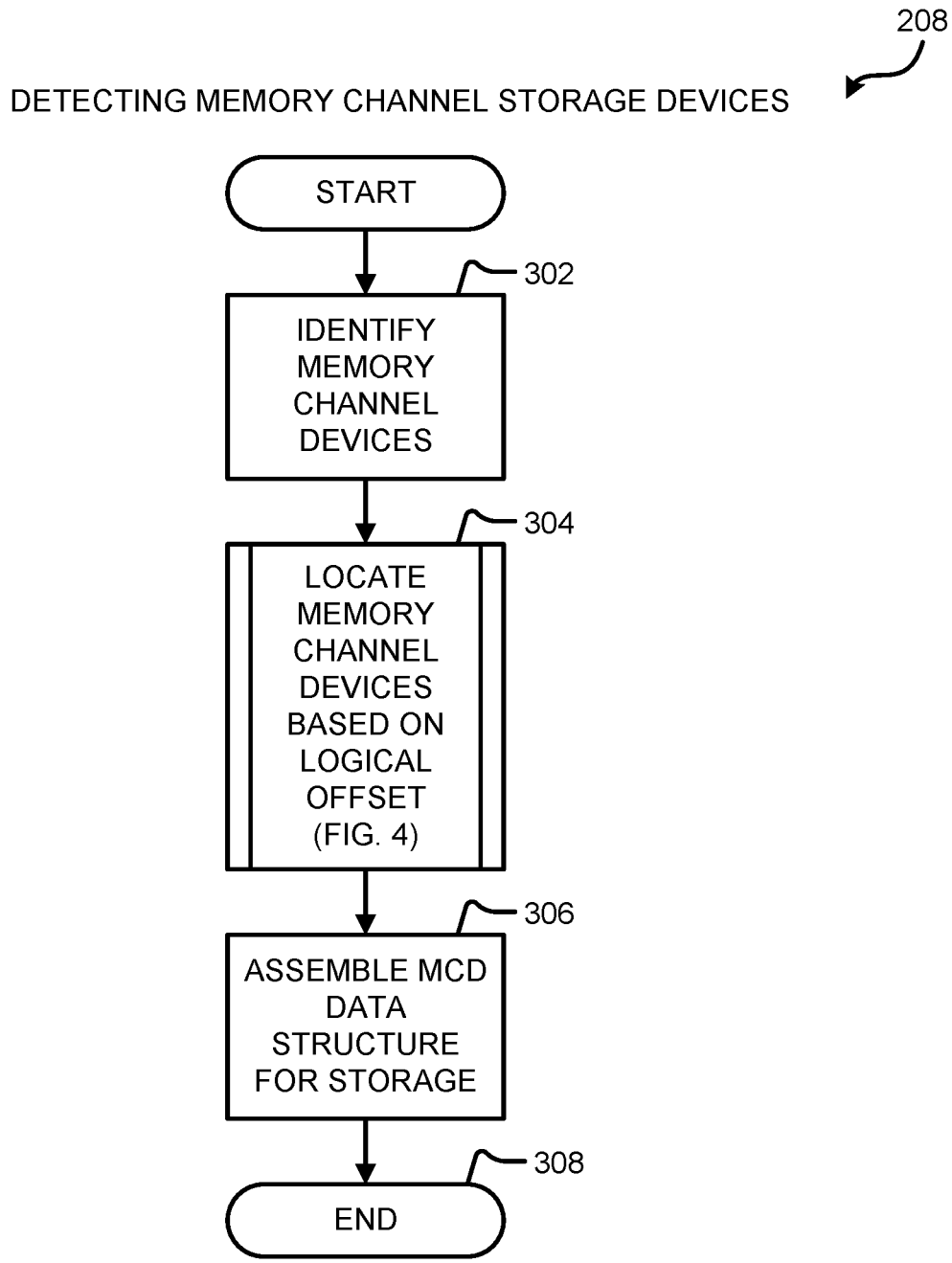
FIG. 3 is a flow diagram showing a routine for detecting a memory channel storage device according to the technologies presented herein.

As shown in FIG. 2, operation 208 includes detecting address data for the memory channel or channels. A more detailed discussion of operation 208 is presented with reference to FIG. 3. FIG. 3 is a flow diagram showing a routine 208 for detecting a memory channel storage device according to the technologies presented herein. The routine 208 includes identifying memory channel devices at operation 302. The memory channel devices may be detected through system management bus 132' polling or otherwise communicating with each SPD chipset 154, 155 in communication with the CPU 102. Upon identifying at least a total number of MCS devices, the routine 208 includes locating the memory channel devices based on a logical offset, at operation 304. In addition to locating the memory channel devices, serial numbers can be determined from the logical offset. These serial numbers can be correlated with the serial numbers in SPD chipset which allows correlating address range data to physical slot data.

Figure 4:
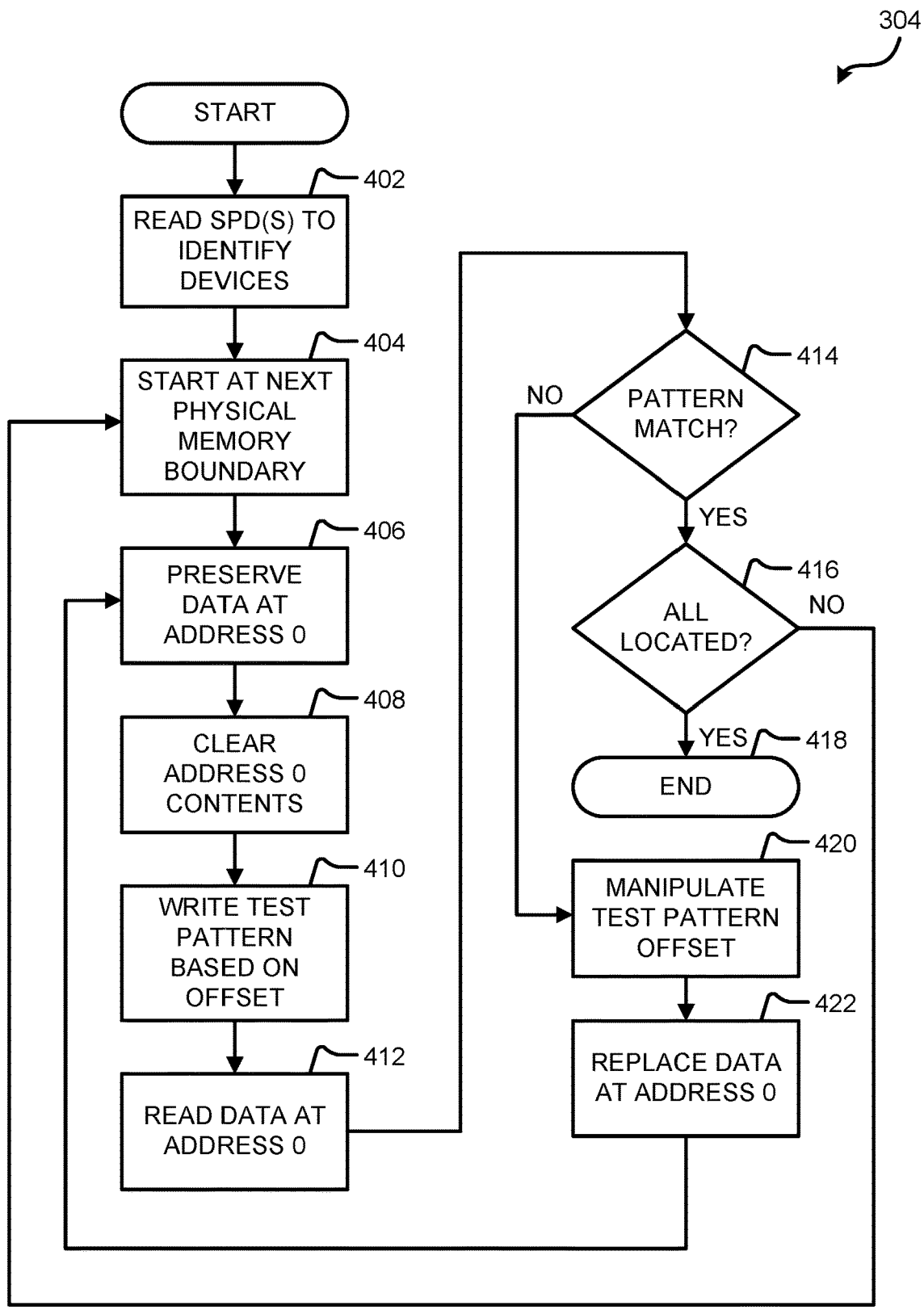
FIG. 4 is a flow diagram showing a routine for detecting a memory channel storage device according to the technologies presented herein.

Operation 304 is described more fully with reference to FIG. 4. After locating all memory channel devices, the firmware 137 may assemble the MCS data for storage at operation 306. The MCS data may be assembled into a simple address data structure identifying an associated CPU, and associated memory channel, an associated physical memory slot, and an associated base address, and may be stored in the NVRAM 136. The routine 208 may cease at operation 308.

FIG. 4 is a flow diagram showing a routine 304 for detecting a memory channel storage device according to the technologies presented herein. As shown, the routine 304 begins at operation 402 where SPD chipsets are read or otherwise accessed through the system management bus 132' to determine at least a total number of MCS devices connected to the computing system 100. Upon identifying the number of MCS devices, the firmware may initiate a search for a location of a MCS device at the next available physical memory boundary, at operation 404.

Based on the appropriate memory boundary, the firmware 137 may preserve data at the associated address 0, at operation 406. Thereafter, the firmware 137 may clear the contents of address 0 at operation 408. While the contents of address 0 are cleared, the firmware 137 may write a unique test pattern on a memory address offset from address 0 by a fixed number of bits, at operation 410. By attempting to write the test pattern at an address offset from the base address, the firmware 137 can test for the existence of an aliased address thereby indicating an existence of a MCS device.

The offset may be a logical offset and may be an initially pre-determined value. According to one implementation, an initial offset is 64 kilobytes, but other initial offsets may be used. Additionally, the test pattern may not necessarily be a pre-determined pattern. Any unique pattern allowing the identification of aliasing may be applicable.

Upon writing the test pattern based on the offset, the firmware 137 may read data at address 0, at operation 412, and determine if a pattern match between the contents of address 0 and the test pattern exists, at operation 414. If there is a match, and if all MCS devices have been located as determined in operation 416, the routine 304 may cease at operation 418. If all MCS devices have not been located, the firmware may begin applying test patterns beginning at the next physical memory boundary at operation 404 while iterating through the operations described above.

Additionally, if there is no match between a test pattern written at an offset address and the contents of address 0, the firmware 137 may manipulate the offset at operation 420. For example, the offset may be increased or decreased in one implementation. According to one particular implementation, the offset is increased by a factor of two at every instance where there is no test pattern match. Thus, for example, an initial offset of 64 kilobytes is increased to 128 kilobytes, while an offset of 128 kilobytes is increased to 256 kilobytes, and so on. Upon manipulating the offset to create a new offset, the firmware 137 may replace the preserved data for address 0 at operation 422, and may move to the new offset and preserve the data at the now larger (or smaller) address 0 space at operation 406 while continuing to test for a pattern match.

As described above, upon identification and locating of all MCS devices, associated base address data, and other identifying information, may be stored for future initialization of the computing system. It should be appreciated that, according to implementations, the mechanisms disclosed herein may allow for relatively easy maintenance of address information for previously installed MCS devices, for identification and locating of new MCS devices, and initialization of MCS devices during an initial boot phase of a computing system.

Figure 5:
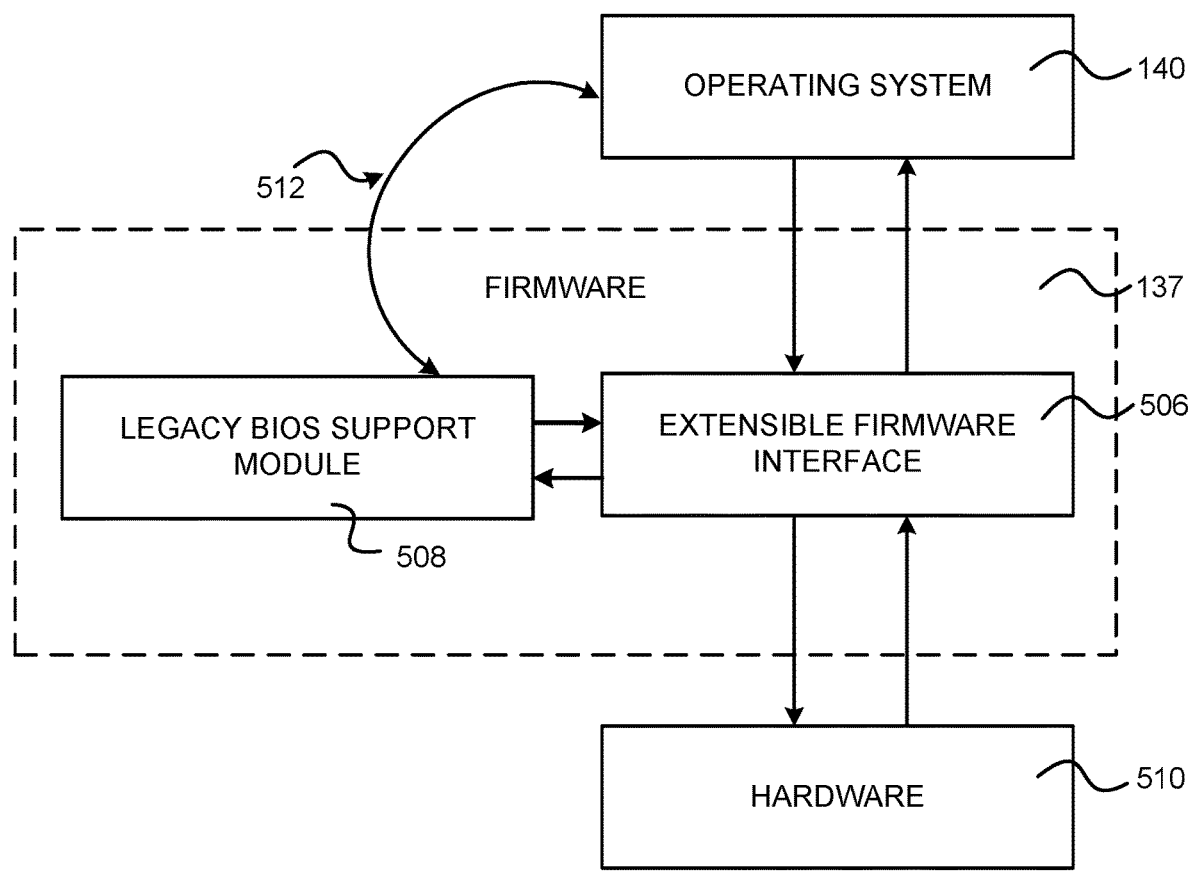
FIG. 5 is a block diagram illustrating aspects of an interface between a firmware and an operating system according to one or more embodiments presented herein.
Figure 6:
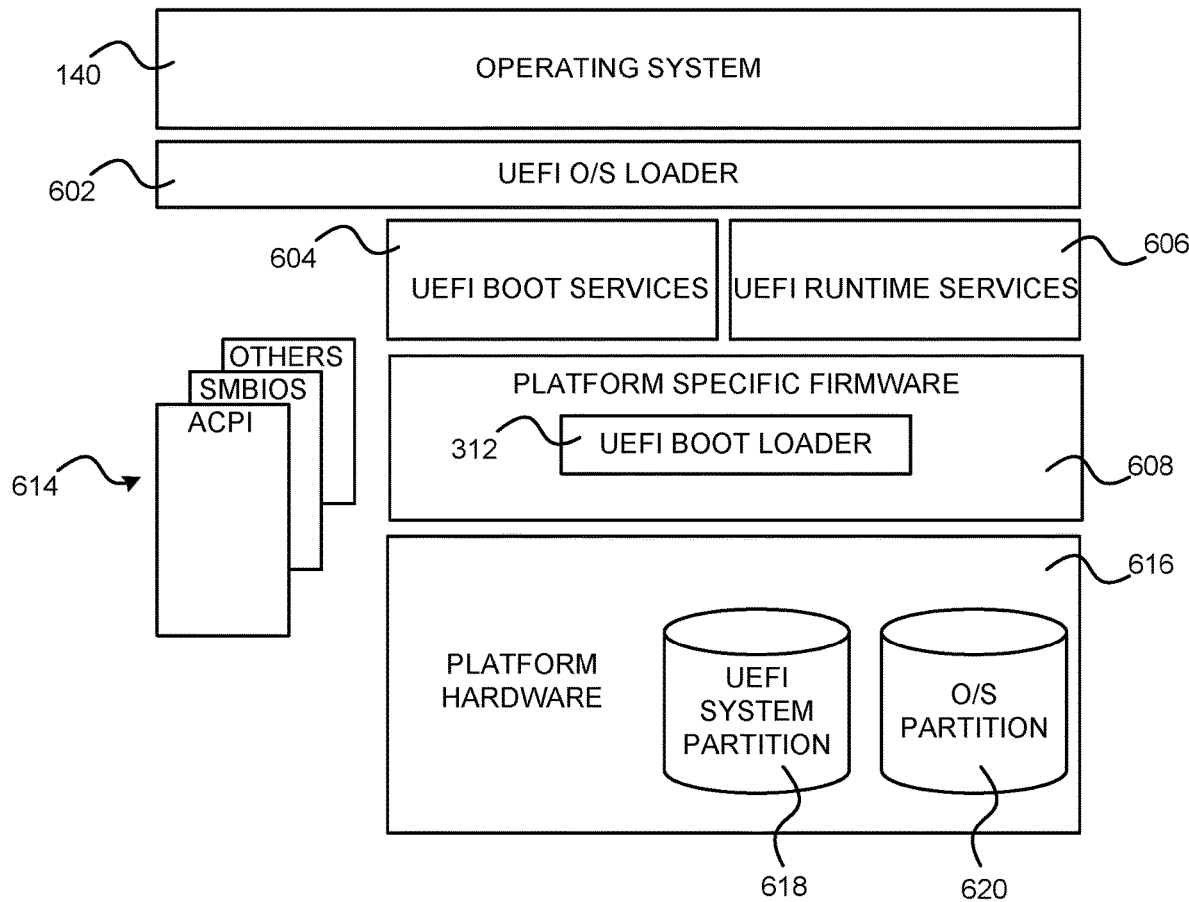
FIG. 6 is a block diagram illustrating an architecture for firmware that provides an operating environment for one or more embodiments presented herein.

Additional details regarding the operation of firmware 137 with regards to components and portions of the computing system 100 are provided with reference to FIGS. 5 and 6. Referring to FIG. 5, a block diagram illustrates aspects of an interface between a UEFI firmware 137 and an operating system 140 according to one or more embodiments presented herein. As described with respect to FIG. 1, the firmware 137 may comprise a firmware compatible with the UEFI Specification (which may be referred to herein as the "Specification") from the UEFI FORUM. The UEFI Specification describes an interface between the operating system 140 and the system firmware 137. The UEFI Specification also defines an interface that platform firmware may implement, and an interface that the operating system 140 may use while booting. How the firmware 137 implements the interface may be left up to the manufacturer of the firmware. The Specification can define a way for the operating system 140 and firmware 137 to communicate information necessary to support the operating system boot process.

According to some embodiments, both a UEFI-compatible firmware 506 and a legacy BIOS support module 508 may be present in the UEFI firmware 137. This allows the computing system 100 to support a UEFI firmware interface and a legacy BIOS firmware interface. In order to provide this functionality, an interface 512 may be provided for use by legacy operating systems and applications. According to other embodiments, only one of the UEFI-compatible firmware 506 and the legacy BIOS support module 508 may be present in the firmware 137. According to yet other embodiments, the firmware 137 may interface with the hardware 510 through any of various other architectures, components, or modules for the firmware without specific involvement of the UEFI-compatible firmware 506 or the legacy BIOS support module 508. Additional details regarding the operation and architecture of a UEFI Specification compliant-firmware can be found in the UEFI Specification and in the specifications that make up the EFI Framework, both of which are expressly incorporated herein by reference.

Turning now to FIG. 6, a block diagram illustrates the architecture for a UEFI specification-compliant firmware that provides an operating environment for one or more embodiments presented herein. As shown in FIG. 6, the architecture can include platform hardware 616 and an operating system 140. The platform firmware 608 may retrieve an operating system ("OS") image from the UEFI system partition 618 using a UEFI boot loader O/S Loader 602 ("OS boot loader 602"). The OS boot loader 602 may retrieve an OS image from the O/S partition 620.

Once started, the OS boot loader 602 may continue to boot the complete operating system 140. In doing so, the OS boot loader 602 may use UEFI boot services 604, runtime services 606, and interface to other supported specifications to survey, comprehend, and initialize the various platform components and the operating system software that manages them. Thus, interfaces 614 from other specifications may also be present on the system. For example, the Advanced Configuration and Power Management Interface ("ACPI") and the System Management BIOS ("SMBIOS") specifications may be supported.

UEFI boot services 604 may provide interfaces for devices and system functionality used during boot time. UEFI runtime services 606 may also be available to the UEFI boot loader 612 during the boot phase. For example, a set of runtime services may be presented to ensure appropriate abstraction of base platform hardware resources used by the operating system 140 during its operation. UEFI allows extension of platform firmware by loading UEFI driver and UEFI application images which, when loaded, have access to UEFI-defined runtime and boot services. Various program modules can provide the boot-time and run-time services.

Based on the foregoing, it should be appreciated that technologies for memory channel storage device initialization have been presented herein. Although the subject matter presented herein has been described in language specific to computer structural features, methodological acts, and computer readable media, it is to be understood that the invention defined in the appended claims is not necessarily limited to the specific features, acts, or media described herein. Rather, the specific features, acts and mediums are disclosed as example forms of implementing the claims.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claim.

What is claimed is:

1. A computer-implemented method, comprising:
polling a serial presence detect (SPD) chipset in a memory channel storage (MCS) device to determine that the MCS device is deployed at a computer;
locating an address range for the MCS device based on a logical offset from a physical memory boundary of a memory of the computer;
determining a serial number for the MCS device based on the logical offset from the physical memory boundary;
correlating the serial number with another serial number stored on the SPD chipset by correlating the address range with a physical slot of the computer; and
storing the address range as a portion of address data for the MCS device in a non-volatile random-access memory (NVRAM) of the computer.

2. The computer-implemented method of claim 1, further comprising,
reserving the address range for the MCS device in response to a next boot of the computer using the address data stored in the NVRAM.

3. The computer-implemented method of claim 1, wherein the address data is stored in the NVRAM as a data structure comprising a central processing unit (CPU) identification, a memory channel identification, a physical slot identification for the physical slot, and a base address for the MCS device.

4. A computer-readable non-transitory storage medium having computer-executable instructions stored thereon that, in response to execution, cause a computer to:
poll a serial presence detect (SPD) chipset in a memory channel storage (MCS) device to determine that the MCS device is deployed at the computer;
locate an address range for the MCS device based on a logical offset from a physical memory boundary of a memory of the computer;
determine a serial number for the MCS device based on the logical offset from the physical memory boundary;
correlate the serial number with another serial number stored on the SPD chipset by correlating the address range with a physical slot of the computer; and
store the address range as a portion of address data for the MCS device in a non-volatile random-access memory (NVRAM) of the computer.

5. The computer-readable storage medium of claim 4, having further computer-executable instructions stored thereon that, in response to execution, cause the computer to,
reserve the address range for the MCS device upon a next boot of the computer using the address data stored in the NVRAM.

6. The computer-readable non-transitory storage medium of claim 4, wherein the address data is stored in the NVRAM as a data structure comprising a central processing unit (CPU) identification, a memory channel identification, a physical slot identification for the physical slot, and a base address for the MCS device.

7. A computing system, comprising:
at least one memory device having computer-executable instructions stored therein; and
at least one processor functionally coupled to the at least one memory device and configured to execute the computer-readable instructions at least to, poll a serial presence detect (SPD) chipset in a memory channel storage (MCS) device to determine that the MCS device is deployed at the computing system;

locate an address range for the MCS device based on a logical offset from a physical memory boundary of a memory of the computing device;

determine a serial number for the MCS device based on the logical offset from the physical memory boundary;

correlate the serial number with another serial number stored on the SPD chipset by correlating the address range with a physical slot of the computer; and store the address range as a portion of address data for the MCS device in a non-volatile random-access memory (NVRAM) of the computer.

8. The computing system of claim 7, wherein the at least one processor is further configured to execute the computer-executable instructions to, reserve the address range for the MCS device upon a next boot of the computing device using the address data stored in the NVRAM.

9. The computing system of claim 7, wherein the address data is stored in the NVRAM as a data structure comprising a central processing unit (CPU) identification, a memory channel identification, a physical slot identification for the physical slot, and a base address for the MCS device.

* * * * *